United States Patent
Shikata

(10) Patent No.: US 7,484,141 B2
(45) Date of Patent: Jan. 27, 2009

(54) SEMICONDUCTOR DEVICE CAPABLE OF PERFORMING TEST AT ACTUAL OPERATING FREQUENCY

(75) Inventor: Takashi Shikata, Kawasaki (JP)

(73) Assignee: Fujitsu Microelectronic Limited, Tokyo (JP)

( * ) Notice: Subject to any disclaimer, the term of this patent is extended or adjusted under 35 U.S.C. 154(b) by 434 days.

(21) Appl. No.: 10/893,412

(22) Filed: Jul. 19, 2004

(65) Prior Publication Data

US 2005/0193293 A1  Sep. 1, 2005

(30) Foreign Application Priority Data

Feb. 27, 2004  (JP) ............................ 2004-054242

(51) Int. Cl.
*G11C 29/00* (2006.01)

(52) U.S. Cl. .................. 714/718; 714/724; 714/775; 714/37; 714/707; 714/731; 714/733; 714/34

(58) Field of Classification Search ......... 714/100–824, 714/30, 34, 37

See application file for complete search history.

(56) References Cited

U.S. PATENT DOCUMENTS

| | | | |
|---|---|---|---|
| 5,617,531 A * | 4/1997 | Crouch et al. | 714/30 |
| 6,388,929 B1 * | 5/2002 | Shimano et al. | 365/201 |
| 6,543,016 B1 * | 4/2003 | Lewandowski et al. | 714/718 |
| 6,560,740 B1 * | 5/2003 | Zuraski et al. | 714/733 |
| 6,829,728 B2 * | 12/2004 | Cheng et al. | 714/30 |
| 2002/0131307 A1 * | 9/2002 | Murai et al. | 365/200 |
| 2002/0194546 A1 * | 12/2002 | Ooishi | 714/42 |
| 2004/0015651 A1 * | 1/2004 | Chadwick et al. | 711/108 |
| 2004/0128596 A1 * | 7/2004 | Menon et al. | 714/724 |

FOREIGN PATENT DOCUMENTS

| | | |
|---|---|---|
| JP | 2000-163993 | 6/2000 |
| JP | 2000-200874 | 7/2000 |
| JP | 2003-346498 | 5/2003 |

* cited by examiner

*Primary Examiner*—Jacques Louis-Jacques
*Assistant Examiner*—Guerrier Merant
(74) *Attorney, Agent, or Firm*—Staas & Halsey LLP

(57) ABSTRACT

A semiconductor device includes a CPU core circuit, a bus connected to the CPU core circuit, and a memory BIST circuit configured to perform a memory test in response to an instruction supplied from the CPU core circuit through the bus.

11 Claims, 11 Drawing Sheets

SEMICONDUCTOR DEVICE CAPABLE OF PERFORMING TEST AT ACTUAL OPERATING FREQUENCY

CROSS-REFERENCE TO RELATED APPLICATIONS

The present application is based upon and claims the benefit of priority from the prior Japanese Patent Application No. 2004-054242 filed on Feb. 27, 2004, with the Japanese Patent Office, the entire contents of which are incorporated herein by reference.

BACKGROUND OF THE INVENTION

1. Field of the Invention

The present invention generally relates to semiconductor devices provided with circuitry for testing a memory, and particularly relates to a semiconductor device provided with a memory BIST circuit for testing a memory and to a voltage control method using a memory BIST circuit.

2. Description of the Related Art

In semiconductor devices such as processors provided with one or more built-in memories, scan chains are generally used to test the operation of each memory through a limited number of external terminals. The SCAN chain is a chain that allows data to propagate as the data is serially input from an exterior. Flip-flops connected in series are provided along the SCAN chain. Data is serially input into the flip-flops from a tester situated outside the semiconductor device, thereby setting an input test pattern for each memory. Results of a test of each memory's operation are output to an exterior, and the tester is used to check whether the tested operation was satisfactory.

In a test method using such a scan chain, data is set according to the clock rate of the external tester. In a current state of technology, however, the clock rate of the external tester is generally far lower than the actual operating frequency used inside the semiconductor device. Because of this, a lengthy time is required for testing memory operations, and it is not possible to detect a malfunction that may occur only when an actual operating frequency is used in the semiconductor device. Such malfunction may include a malfunction that is caused by the failure affecting a delay time, e.g., a contact failure.

There is a test method that provides a memory BIST (Built-In-Self-Test) circuit around each memory and uses this memory BIST circuit to generate a test pattern and to check test results (for example, Japanese Patent Application Publication No. 2000-163993, Japanese Patent Application Publication No. 2003-346498, Japanese Patent Application Publication No. 2000-200874). Even where a memory BIST circuit is used, the memory BIST circuit is connected to a SCAN chain, and data for controlling the memory BIST circuit is supplied through the SCAN chain from outside the device. Namely, the control of the memory BIST circuit is carried out according to the clock rate of the external tester, and, also, the operation of the memory BIST circuit is performed at this clock rate. Consequently, the test of memory operations requires a lengthy time, and fails to detect a malfunction that may come to the surface only when an actual operating frequency is used.

SUMMARY OF THE INVENTION

It is a general object of the present invention to provide a semiconductor device and a check method that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device and a check method particularly pointed out in the specification in such full, clear, concise, and exact terms as to enable a person having ordinary skill in the art to practice the invention.

To achieve these and other advantages in accordance with the purpose of the invention, the invention provides a semiconductor device including a CPU core circuit, a bus connected to the CPU core circuit, and a memory BIST circuit configured to perform a memory test in response to an instruction supplied from the CPU core circuit through the bus.

According to another aspect of the invention, a method of controlling a voltage in a semiconductor device which includes a CPU core circuit, a bus connected to the CPU core circuit, and the memory BIST circuit configured to perform a memory test in response to an instruction supplied from the CPU core circuit through the bus, includes the steps of switching to a voltage control mode, changing a level of an internal power supply voltage after the switching to the voltage control mode, checking by use of the memory BIST circuit whether a memory operation is normal at the internal power supply voltage having the level thereof changed, changing the level of the internal power supply voltage if the checking indicates anomaly of the memory operation, followed by performing the checking again, and switching from the voltage control mode to a normal operation if the checking indicates normalcy of the memory operation.

According to at least one embodiment of the invention, memory operations are properly tested according to routine instructions issued from the CPU core without using a scan chain. This provides for the test of a memory operation to be readily conducted at an operating frequency of the semiconductor device, without a need for the switching of clocks. This makes it possible to effectively detect a delay-associated failure such as a contact failure that may not come to the surface in an operation test conducted at a low clock rate. Moreover, at least one embodiment of the invention provides for various types of tests to be readily conducted at high speed through simple manipulation of register settings, and makes it possible to avoid performing operation tests more than necessary by selecting only desired operation tests through program-based settings. Further, the testing of a memory operation is readily conducted on a board without use of an external tester, making it easier to test semiconductor devices while they are mounted on the board as in a final product. In the on-board environment, various factors may cause power supply noise and a voltage drop. As the invention makes it possible to test the operation of voltage-sensitive memories at an actual operating frequency, the invention can effectively be used for guaranteeing device operations.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
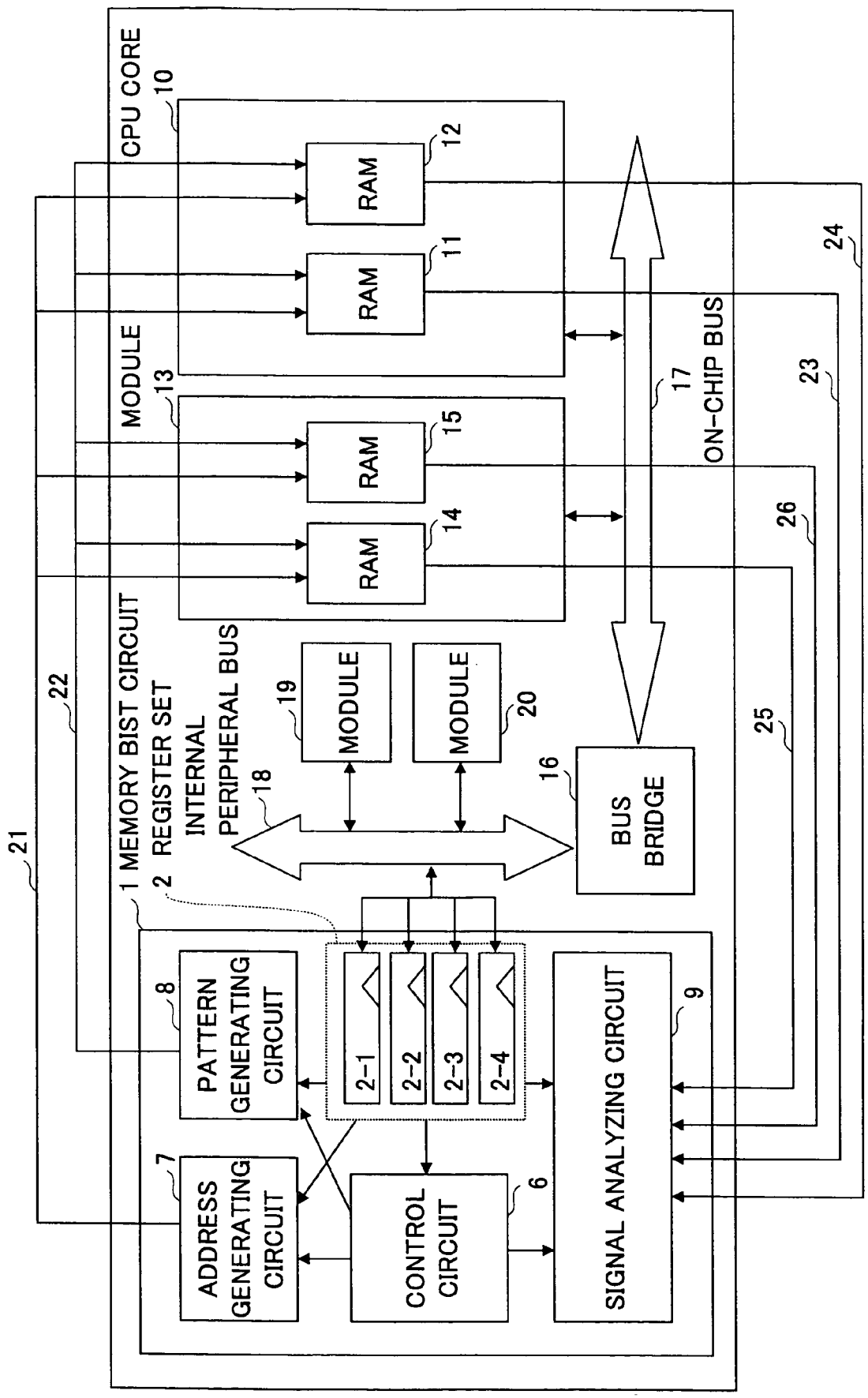
FIG. 1 is a block diagram showing the construction of a first embodiment of a semiconductor device in which a memory BIST circuit is incorporated according to the invention.

The memory BIST circuit may be designed such that the PLL or the like is used to allow the test to be conducted at actual operating frequency of the semiconductor device. Even with such design, however, data for controlling the memory BIST circuit needs to be supplied through a SCAN chain from outside the semiconductor device. This necessitates a special circuit that allows frequencies to be switched from a low-speed scan clock to a high-speed PLL clock without causing any timing glitch. It is difficult to design such circuit. This is thus not a preferred option.

Accordingly, there is a need for a semiconductor device which is provided with a memory BIST circuit that is capable of detecting a malfunction occurring only at the actual operating frequency of the semiconductor device, without a complex circuit design that would be necessary for clock switching.

Moreover, it is not desirable to provide a memory BIST circuit for every single one of the memories when considering circuit size. It is thus preferable to consolidate memory BIST circuits into a single location in the semiconductor device. When a single memory BIST circuit is to be used to test all memories provided inside the semiconductor chip, such memory BIST circuit needs to be able to cope with various bit, word, and column configurations of respective memories. Japanese Patent Application Publication No. 2000-163993 discloses an invention that reduces circuit size by providing a single memory BIST circuit capable of generating a BIST pattern corresponding to maximum bit size and word size. There is a problem, however, in that a design change is necessary each time a product is developed with different memory configuration. There is also a problem in that it is difficult to attend to diligent control such as the masking of bits when those bits are not used in particular memories. Japanese Patent Application Publication No. 2003-346498 discloses an invention that selectively switches the outputs of memories so as to allow a test to be conducted by a single memory BIST circuit.

Accordingly, there is a need for a semiconductor device that is provided with a memory BIST circuit capable of coping with various memory configurations wherein the memory BIST circuit is provided at a single consolidated location in the semiconductor device.

Moreover, the use of finer process technology results in an increase in the circuit scale of a semiconductor device and also an increase in power consumption. As a consequence, the proportion of leak currents in the entire power consumption becomes so large that it cannot be disregarded. In order to cope with this, an internal power supply voltage may be stepped down when high-speed operations are not required, or the internal power supply may be stopped. When the internal power supply voltage is stepped down, there is a question as to whether core circuits can properly operate. Especially, memories are sensitive to voltage levels. It is possible that access time worsens as a result of a voltage drop. When a voltage is stepped down, therefore, it is necessary to provide a means to check, through a program, whether memories can properly operate. Japanese Patent Application Publication No. 2000-200874 discloses a technology that automatically tests the power supply margin and data retention of a RAM when power supply voltages are switched inside an LSI. It would be efficient if such memory check is conducted by use of a memory BIST circuit.

Accordingly, there is a need for a method of checking, by use of a program and a memory BIST circuit, whether a memory will properly operate at the time of a voltage change in a semiconductor device.

In the following, embodiments of the present invention will be described with reference to the accompanying drawings.

FIG. 1 is a block diagram showing the construction of a first embodiment of a semiconductor device in which a memory BIST circuit is incorporated according to the invention. The semiconductor device of FIG. 1 is a processor that operates at high operating frequency by use of a clock signal output from a PLL, for example, and includes a memory BIST circuit 1, a CPU core 10, a module 13, a bus bridge 16, an on-chip bus 17, an internal peripheral bus 18, a module 19, a module 20, a control signal line 21, a write-data signal line 22, and read-data signal lines 23 through 26. The CPU core 10 includes an instruction cache RAM 11 and a data cache RAM 12. The module 13 includes an in-module RAM 14 and an in-module RAM 15. The memory BIST circuit 1 is provided for the purpose of testing the operations of the instruction cache RAM 11, the data cache RAM 12, the in-module RAM 14, and the in-module RAM 15. For the sake of explanation, a PLL circuit and other circuitries irrelevant to the operation of the memory BIST circuit 1 are omitted from the illustration.

The memory BIST circuit 1 includes a register set 2 containing registers 2-1 through 2-4, a control circuit 6, an address generating circuit 7, a pattern generating circuit 8, and a signal analyzing circuit 9. The memory BIST circuit 1 is provided at a predetermined block inside the semiconductor device. The CPU core 10 accesses the register set 2 of the memory BIST circuit 1 through the on-chip bus 17, the bus bridge 16, and the internal peripheral bus 18. The CPU core 10 executes program instructions to store predetermined control values in the register set 2, thereby controlling the memory BIST circuit 1 in accordance with instruction from the CPU core 10. The register set 2 includes one or more result-storage registers for storing the results of a memory operation test. The CPU core 10 refers to register values stored in the result-storage registers after the completion of a test, thereby readily checking whether the memory operation is proper.

The memory BIST circuit 1 operates at the high operating frequency that is actually used by the semiconductor device to operate, and performs the test of the RAM 11, 12, 14, and 15. The control circuit 6 is a state machine, and controls the operation of the address generating circuit 7, the pattern generating circuit 8, and the signal analyzing circuit 9 according to the register values of the register set 2. The address generating circuit 7 generates address signals for specifying an access location of the RAMs, and also generates various control signals such as a write enable WE, a chip enable CE, and a DM signal. The pattern generating circuit 8 generates test patterns such as a march pattern, a checker board pattern, a stripe pattern, a data-mask function test pattern, and a gallop pattern. The generated test patterns are supplied through the write-data signal line 22 and written at a RAM address specified by an address signal on the control signal line 21.

Thereafter, data is read from a RAM address specified by an address signal on the control signal line 21 to travel through one of the read-data signal lines 23 through 26 for storage in the signal analyzing circuit 9. The pattern generating circuit 8 generates expected data that is associated with the conducted test operation, and supplies the expected data to the signal analyzing circuit 9. The signal analyzing circuit 9 compares data read from the RAM with the expected data supplied from the pattern generating circuit 8, thereby checking whether the operation of the RAM is proper. The results of the check are stored in one or more registers 2-1 through 2-4 of the register set 2 serving as one or more result-storage registers. The CPU core 10 reads a resister value stored in the result-storage register so as to check whether the RAM operation is proper.

The result-storage register may be a single register or a plurality of registers each provided for a corresponding RAM. If a single result-storage register stores all the RAM test results, each bit may be assigned to a corresponding RAM. In this case, A value "1/0" of each bit of the register indicates a normal/abnormal status of a corresponding RAM.

The control circuit 6 that is a state machine may be provided with a memory selection control state, so that any desired one of the RAMs 11, 12, 14, and 15 can be selected for a test. In connection with this, the control value stored in the register set 2 may specify a particular RAM as a test target, and, further, such provision may be made that all the memories are successively selected and tested in an automatic manner.

The memory BIST circuit 1 may be consolidated in a particular section of the semiconductor device for the reduction of circuit size, or may be provided as a wrapper circuit separately for each memory so as to cope with an existing ASIC configuration or the like.

With the memory BIST circuit of the invention described above, memory operations are properly tested according to routine instructions issued from the CPU core 10 without using a scan chain. This provides for the test of a memory operation to be readily conducted at an operating frequency of the semiconductor device, without a need for the switching of clocks. This makes it possible to effectively detect a delay-associated failure such as a contact failure that may not come to the surface in an operation test conducted at a low clock rate. Moreover, the invention provides for various types of tests to be readily conducted at high speed through simple manipulation of register settings, and makes it possible to avoid conducting operation tests more than necessary by selecting only desired operation tests through program-based settings. Further, the testing of a memory operation is readily conducted on a board without use of an external tester, making it easier to test semiconductor devices while they are mounted on the board as in a final product. In the on-board environment, various factors may cause power supply noise and a voltage drop. As the invention makes it possible to test the operation of voltage-sensitive memories at an actual operating frequency, the invention can effectively be used for guaranteeing device operations.

In the following, a more detailed description will be given of the operation of the address generating circuit 7 and the pattern generating circuit 8 of the memory BIST circuit 1.

As previously described, it is not desirable, in terms of area size, to provide a memory BIST circuit separately for each memory, and consolidation at a single location in the semiconductor device is preferred. When a single memory BIST circuit is to be used to test all memories provided inside the semiconductor chip, such memory BIST circuit needs to be able to cope with various bit, word, and column configurations of respective memories. In the memory BIST circuit 1 of the present invention, the register set 2 includes registers for setting the number of bits of an address signal, the bit width of a data signal, the presence/absence of a data masking function, the type of a memory (one port, two ports, or the like), etc. Then, the address generating circuit 7 and the pattern generating circuit 8 generate test patterns according to these register settings.

Specifically, a register of the register set 2 may store a value indicative of an address width. Based on this register value, the address generating circuit 7 determines a range of addresses within which a march test or the like is performed for a RAM, and generates address signals according to the determined address range. Moreover, a register of the register set 2 may store a value indicative of a data bit width. Based on this register value, the pattern generating circuit 8 generates a test pattern.

Figure 2:
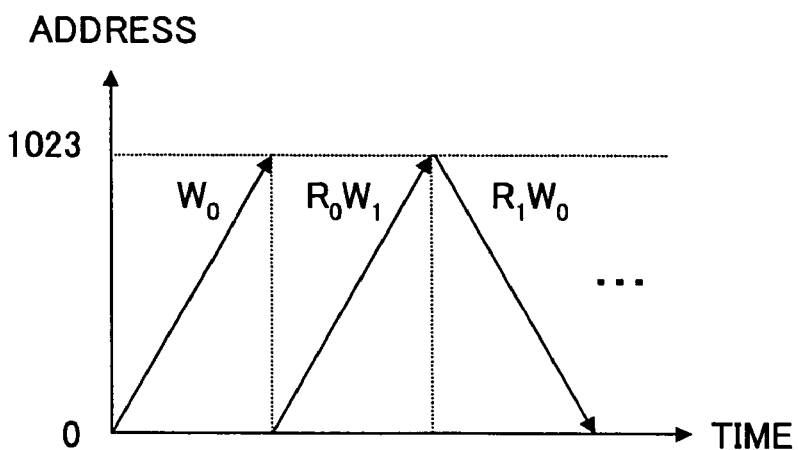
FIG. 2 is a diagram showing an example of an address pattern generated by an address generating circuit.
Figure 3:
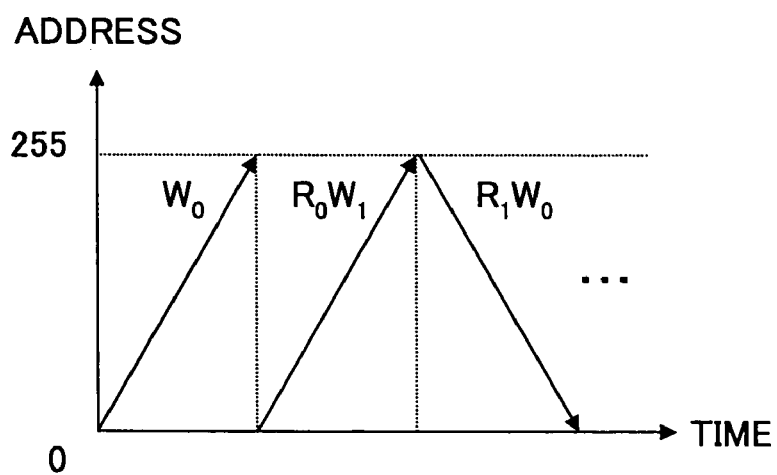
FIG. 3 is a diagram showing another example of an address pattern generated by the address generating circuit.

FIG. 2 is a diagram showing an example of an address pattern generated by the address generating circuit 7. Register values stored in the register set 2 may indicate 10 bits as an address width and a march test as a test type. In this case, as shown in FIG. 2, the address generating circuit 7 generates address signals that successively increase from a 0-th address to a 1023-rd address. FIG. 3 is a diagram showing another example of an address pattern generated by the address generating circuit 7. Register values stored in the register set 2 may indicate 8 bits as an address width and a march test as a test type. In this case, as shown in FIG. 3, the address generating circuit 7 generates address signals that successively increase from a 0-th address to a 255-th address. In FIG. 2 and FIG. 3, Wn represents an n-th write operation, and Rn represents an n-th read operation.

As described above, provision is made to set various parameters such as an address signal width, a data signal width, etc., for memory operation tests. With this provision, a general-purpose memory BIST circuit that is independent of the product types of semiconductor devices is provided, and circuit size can be kept to a minimum because only a single memory BIST circuit is necessary.

In the following, a description will be given with respect to a variation of the operation of the signal analyzing circuit 9 of the memory BIST circuit 1.

There may be a case in which some bits are not used in a tag-RAM used in the CPU core 10, or may be a case in which several bits from the highest-order bit are not used in a data RAM. In such cases, it is preferable to mask desired bit positions as a data signal is compared with an expected value in the signal analyzing circuit 9. To this end, the register set 2 of the memory BIST circuit 1 is provided with a register for the purpose of mask control. The signal analyzing circuit 9 masks some bit positions of data retrieved from a RAM by replacing them with either "0" or "1" as such bit positions are specified by the register setting. The signal analyzing circuit 9 also masks some bit positions of an expected value by replacing them with either "0" or "1" as such bit positions are specified by the register setting.

Figure 4:
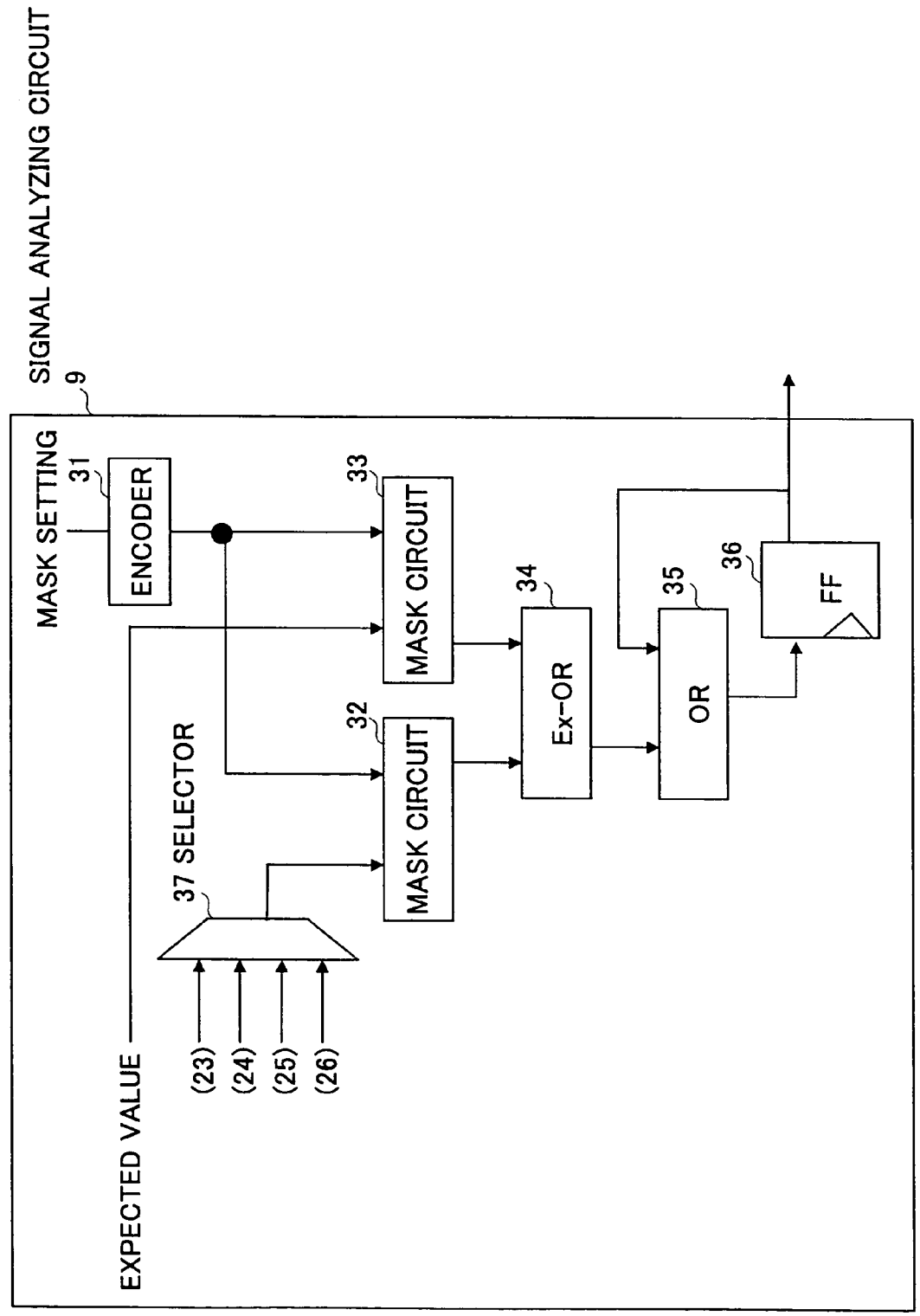
FIG. 4 is a circuit diagram showing an example of the construction of a signal analyzing circuit equipped with a masking function.

FIG. 4 is a circuit diagram showing an example of the construction of the signal analyzing circuit 9 equipped with a masking function.

The signal analyzing circuit 9 of FIG. 4 includes an encoder 31, mask circuits 32 and 33, an EXOR circuit 34, an OR circuit 35, a flip-flop 36, and a selector 37. The encoder 31 receives a mask setting from a predetermined register of the register set 2, and encodes the mask setting to generate a data mask signal. The selector 37 selects one of the read-data signal lines 23 through 26 to supply corresponding read data to the mask circuit 32. The mask circuit 32 masks the supplied read data by using the data mask signal from the encoder 31. By the same token, the mask circuit 33 masks an expected value supplied from the pattern generating circuit 8 by using the data mask signal from the encoder 31.

Masked data output from the mask circuits 32 and 33 are subjected to exclusive OR operation by the EXOR circuit 34 on a bit-by-bit basis. When these data match completely, all the bits become zero. The OR circuit 35 performs an OR operation between an n-bit output from the EXOR circuit 34 and an n-bit output from the flip-flop 36 on a bit-by-bit basis, and supplies a resulting n-bit output to the flip-flop 36. With the feedback of the output of the flip-flop 36 to the OR circuit 35, the output of the flip-flop 36 ends up having a bit that is "1" if a series of read data and a series of expected values do not match even once. With this provision, a failure of a tested RAM operation is properly detected.

With the masking of read data and expected data by use of a data mask signal, as described above, it is possible to choose not to conduct a test for some bits for which there is no need to detect any failure. This improves the yield of semiconductor devices by choosing not to detect memory failures that do not affect memory operations.

In the following, a second embodiment of the semiconductor device according to the invention will be described.

When a memory BIST circuit is implemented as a wrapper circuit around a memory as in a conventional configuration, at least one stage of a selector needs to be inserted into a path for memory input/output. If such a selector is inserted into a path leading to a cash RAM of the CPU, it may worsen the timing of a critical path when such a critical path is already critical as to its timing. On the other hand, the provision of signal lines dedicated for use in the memory BIST test results in an undesirable increase in the number of signal lines. In the second embodiment described below, a selector is provided at a location where timing is not critical along a data bus, and the switching of polarities of a test signal allows the memory BIST circuit to access a memory in a pipeline manner.

Figure 5:
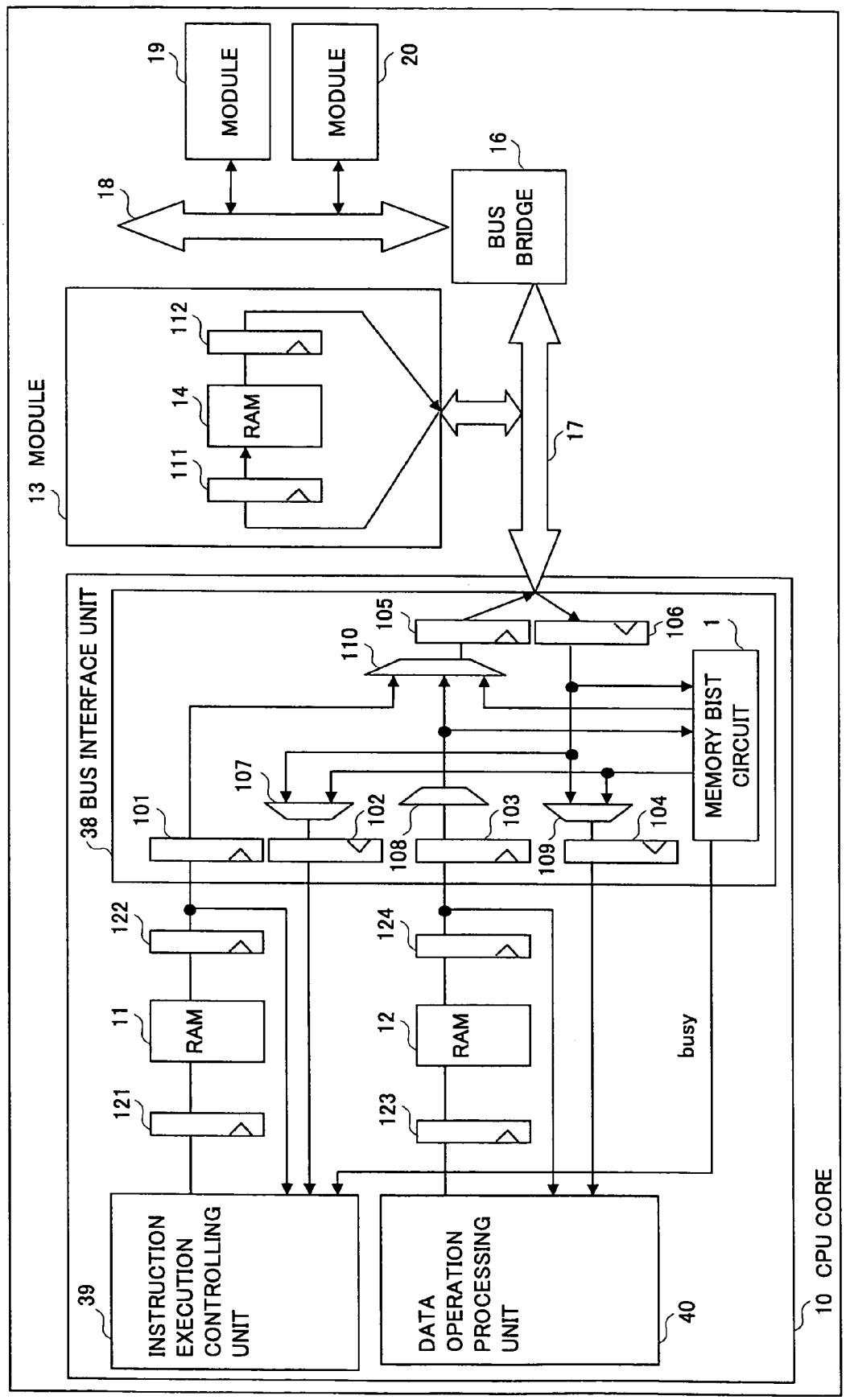
FIG. 5 is a block diagram showing an example of the second embodiment of the semiconductor device that includes a memory BIST circuit according to the invention.

FIG. 5 is a block diagram showing an example of the second embodiment of the semiconductor device that includes a memory BIST circuit according to the invention.

In the semiconductor device of FIG. 5, a bus interface unit 38 is formed in the CPU core 10, and the memory BIST circuit 1 is incorporated in the bus interface unit 38. The bus interface unit 38 includes buffer registers 101 through 106 and selectors 107 through 110. The CPU core 10 includes the instruction cache RAM 11, the data cache RAM 12, an instruction execution controlling unit 39, a data operation processing unit 40, and buffer registers 121 through 124.

The data bus that is used for data transfer during a normal, routine operation is switched by each selector for use by the memory BIST circuit 1 during a test operation. Test data for testing the instruction cache RAM 11 is written by the memory BIST circuit 1 into the instruction cache RAM 11 through the selector 107, the buffer register 102, the instruction execution controlling unit 39, and the buffer register 121. When this is done, each intervening buffer register is synchronized with a clock signal, thereby achieving pipeline operations. Further, a path is provided through which data read from the instruction cache RAM 11 is supplied to the memory BIST circuit 1 through pipeline operations. Test data for testing the data cache RAM 12 is written by the memory BIST circuit 1 into the data cache RAM 12 through the selector 109, the buffer register 104, the data operation processing unit 40, and the buffer register 123. Further, a path is provided through which data read from the data cache RAM 12 is supplied to the memory BIST circuit 1 through pipeline operations. In the same manner, the in-module RAM 14 of the module 13 can be tested. Please note that buffer registers 111 and 112 are provided at the input and output ports of the in-module RAM 14, respectively.

Selection signals supplied to the selectors of the bus interface unit 38 are generated based on signals indicative of a test operation and the like, which are provided from the memory BIST circuit 1.

Since a data bus is utilized for the purpose of testing the instruction cache RAM 11, there is a possibility that data for the RAM test accidentally enter the instruction executing unit of the instruction execution controlling unit 39, thereby causing a malfunction such as a hangup. In order to prevent this, a busy signal is asserted by the memory BIST circuit 1 during the memory test so as to suspend the decoding of instruction data at the instruction execution controlling unit 39. The decoding of instruction data may be resumed after the busy signal is negated upon the completion of a memory test.

According to the second embodiment as described above, a selector is provided at a location where timing is not critical along an existing data bus, and switches connections of the data bus for use by the memory BIST circuit 1. This does not particularly worsen memory access timing at the time of a normal, routine operation. Moreover, the utilization of an existing data bus makes it possible to eliminate data signal lines that are dedicated for memory tests, thereby improving latitude in wire arrangement when a layout is determined, and also reducing area size required for wiring. Further, the operation of the instruction executing unit is suspended by a busy signal when testing an instruction cache RAM, which serves to prevent the CPU from suffering a hangup.

In the following, a third embodiment of the semiconductor device according to the invention will be described.

When the operating frequency of a semiconductor device increases from hundreds Mega-hertz to the order of Giga-hertz, the transfer of data between the memory BIST circuit 1 and memories requires an increased time length. As such time length is increased relative to the clock cycle, it becomes difficult to ensure proper operations timing-wise. Especially with the provision of the memory BIST circuit 1 consolidated in a single location, a distance from this location to each memory causes such timing issues to come to the surface. In consideration of this, the third embodiment provides buffer registers (pipeline registers) along a path through which data is supplied from the memory BIST circuit 1 to a memory and along a path through which data is read from the memory to the memory BIST circuit 1, thereby achieving pipeline operations.

Figure 6:
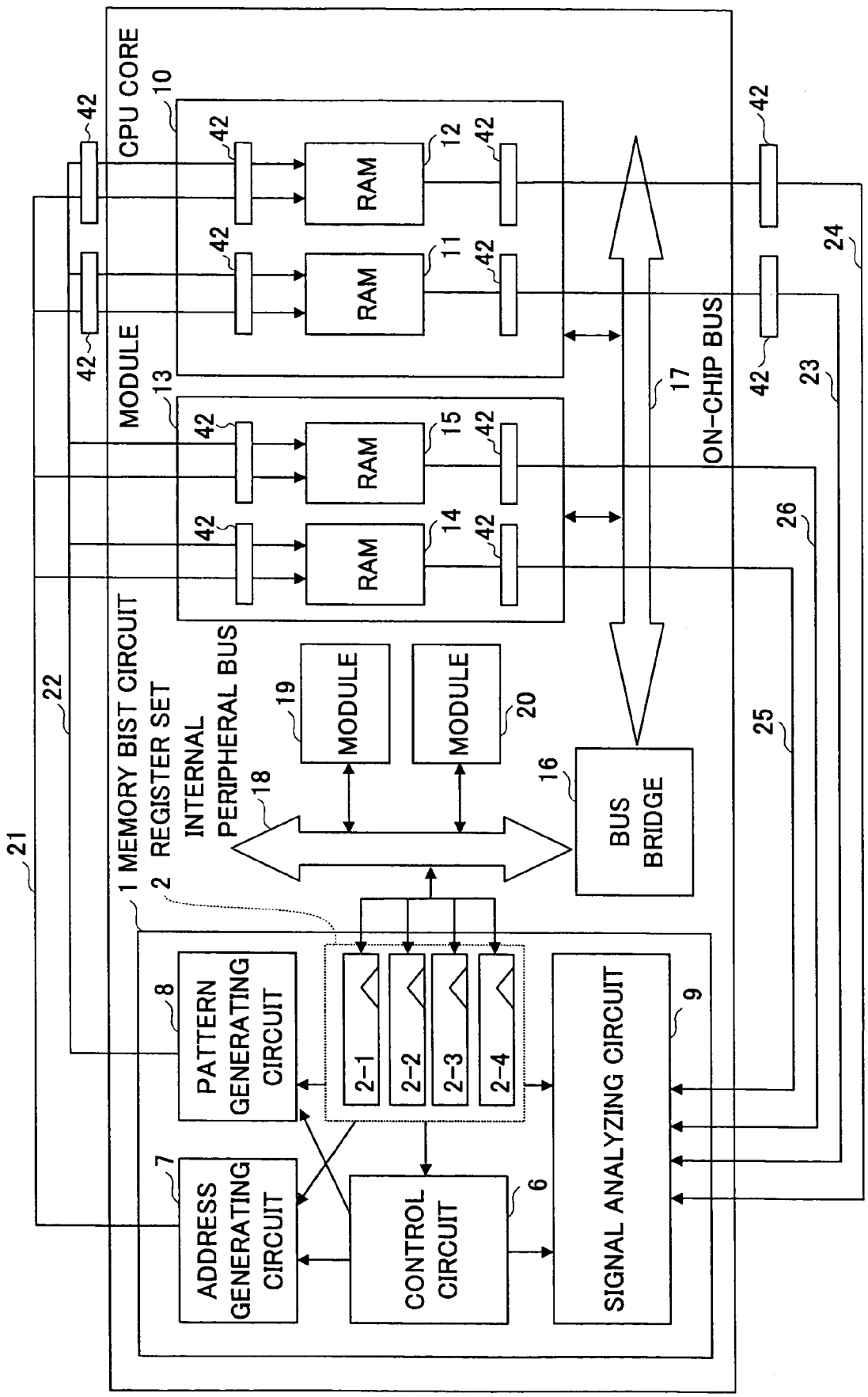
FIG. 6 is a block diagram showing an example of the third embodiment of the semiconductor device in which the memory BIST circuit is included according to the invention.

FIG. 6 is a block diagram showing an example of the third embodiment of the semiconductor device in which the memory BIST circuit is included according to the invention. In FIG. 6, the same elements as those of FIG. 1 are referred to by the same numerals, and a description thereof will be omitted.

In the semiconductor device of FIG. 6, pipeline registers 42 are provided along the signal paths that are formed by the control signal line 21 and the write-data signal line 22. Further pipeline registers 42 are provided on the signal paths that are formed by the read-data signal lines 23 through 26. Since the CPU core 10 is farther away from the memory BIST circuit 1 than the module 13 is, the number of stages of the pipeline registers 42 is larger for the CPU core 10. In this manner, the pipeline registers 42 are provided along the signal paths, and signals are synchronized with a clock at each pipeline register 42, so that receiving ends can properly receive the signals in synchronization with the clock without worrying about signal delay. The clock timing at which the signals are received at the receiving ends are delayed in commensurate with the number of stages of the pipeline registers 42 inserted along the signal paths. As pipeline operations are achieved with respect to a series of data items successively transferred, data is continuously read from a memory at consecutive clock cycles.

Figure 7:
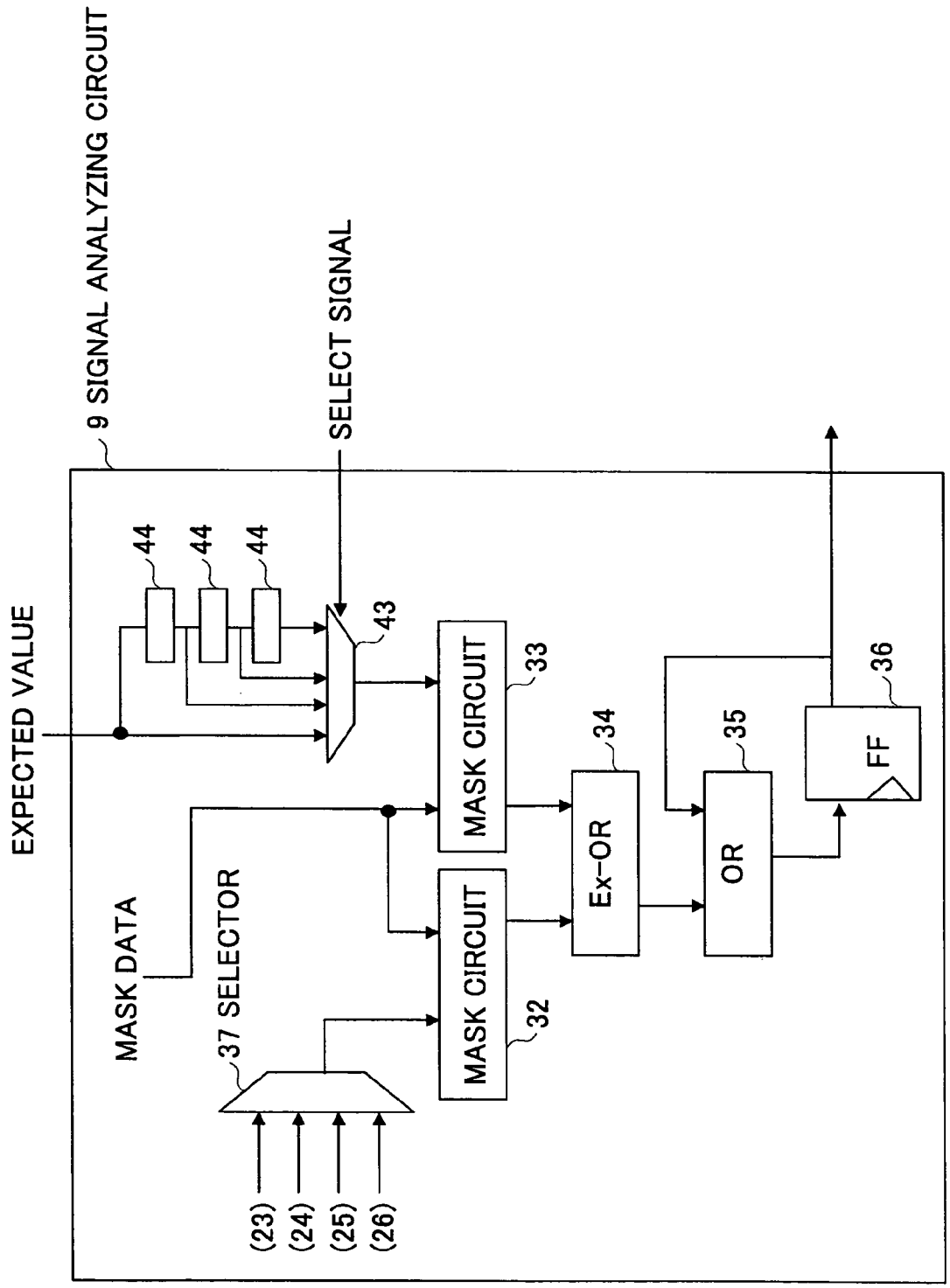
FIG. 7 is a circuit diagram showing an example of the construction of the signal analyzing circuit according to the third embodiment.

FIG. 7 is a circuit diagram showing an example of the construction of the signal analyzing circuit 9 according to the third embodiment. In FIG. 7, the same elements as those of FIG. 4 are referred to by the same numerals, and a description thereof will be omitted.

Since data read from RAM will be delayed according to the number of pipeline stages, it is necessary to delay the timing of an expected value by a corresponding delay as the expected value is provided for comparison in the signal analyzing circuit 9. In the signal analyzing circuit 9 of FIG. 7, a plurality of stages of buffer registers 44 delays the timing of an expected value in synchronization with a clock as the expected value is supplied from the pattern generating circuit 8. Expected values having different delays output from the respective buffer registers 44 are supplied to a selector 43 together with the expected value of the original timing. The selector 43 selects one of the inputs according to a select signal. With this provision, a memory test is properly conducted with respect to any number of pipeline stages.

The select signal supplied to the selector 43 may be changed according to a register setting that is stored by program instructions or the like in a register of the register set 2 for the purpose of indicating the number of pipeline stages.

In the following, a description will be given of a further variation of the signal analyzing circuit 9.

There has been no known method for effectively analyzing defects that are attributable to dynamic causes such as interference between address signal lines inside a memory operating at high operating frequency. Check and analysis of actual products were not possible in the past, and only way to identify the cause of failure is to use a SPICE simulation or the like. In the following, a description will be given of the configuration of the signal analyzing circuit 9 that is suitable for the analysis of failure of a memory operating at high operating frequency.

Figure 8:
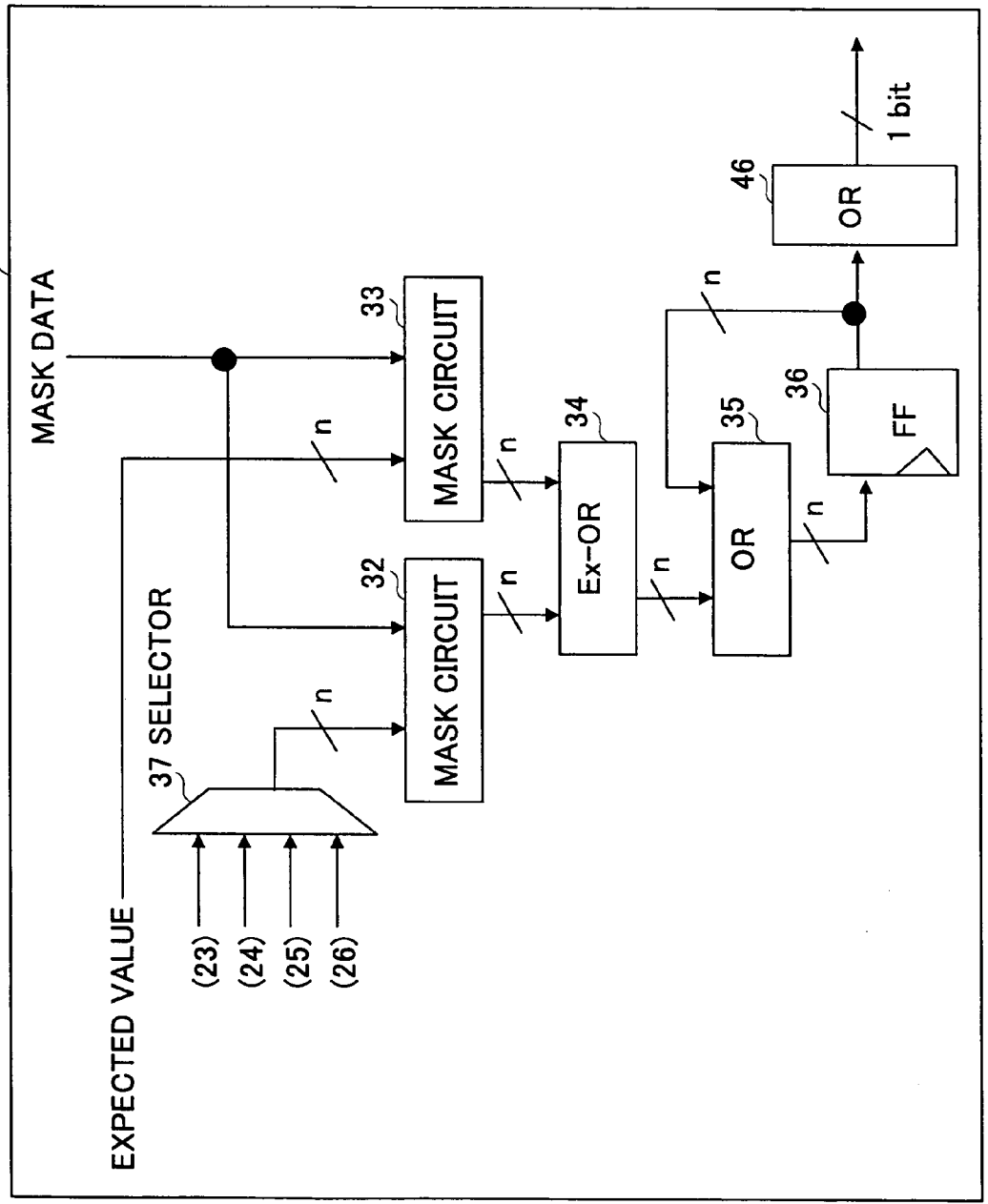
FIG. 8 is a circuit diagram showing an example of the construction of the signal analyzing circuit that is suitable for the analysis of failure of a memory operating at high operating frequency.

FIG. 8 is a circuit diagram showing an example of the construction of the signal analyzing circuit 9 that is suitable for the analysis of failure of a memory operating at high operating frequency. In FIG. 8, the same elements as those of FIG. 4 are referred to by the same numerals, and a description thereof will be omitted.

As was described in connection with FIG. 4, the output of the flip-flop 36 is feed back to the OR circuit 35 so that the output of the flip-flop 36 ends up having a bit that is "1" if a series of read data and a series of expected values do not match even once. With this provision, a failure of a tested RAM operation is properly detected. In the configuration shown in FIG. 8, an OR circuit 46 is additionally provided to obtain a logic sum of all the output bits of the flip-flop 36 and to output a result of the logic sum as a 1-bit signal. This 1-bit output signal becomes "1" the moment a mismatch occurs even once between a series of read data and a series of expected values, regardless of the bit position of such a mismatch.

This signal is supplied as a BIST stop signal to the control circuit 6, the address generating circuit 7, and the pattern generating circuit 8 of the memory BIST circuit 1. Each of these circuits suspends its operation the moment the BIST stop signal is asserted (i.e., "1"), and thereafter holds its current circuit state.

In this manner, the operation of the memory BIST circuit 1 is immediately suspended the moment a memory failure is detected. Then, an indication of a selected memory, an indication of an address being addressed, a type of a BIST test currently performed, and a state signal indicative of a control state are retrieved from the memory BIST circuit 1 to know what processing stage of the BIST test was being performed, what is the data that was read from the RAM, etc. A failure-analysis-purpose setting register and a failure-analysis-purpose-data reading register may be provided in the register set 2, thereby allowing these indications and data to be read from outside. It should be noted that in the configuration shown in FIG. 8, the mask circuit for the masking purpose may properly be removed.

Moreover, a setting made in the register set 2 by program instructions or the like may allow a memory operation test to be resumed from where it has been suspended. In order to achieve more detailed failure analysis, various parameters for failure analysis may be set in the registers by program instructions or the like, such that an elemental unit of patterns generated by the memory BIST circuit 1 (continuous-write, read-write, write-read, data masking setting, write-data setting, expected-value setting, or the like) can be generated for a particular address. Moreover, the control state of the control circuit 6 and the various parameters described above may be set in the registers by program instructions or the like, such that any desired memory operation test can be started from any desired state.

In what follows, a description will be given of a further variation of the signal analyzing circuit 9.

For some processors such as those operating at high operating frequency, scans for logic units are not provided because of timing disadvantages, and a test at the time of shipping out is performed by executing CPU instructions. Where the memory BIST circuit of the invention is applied to such semiconductor device, the test of memory operations would be unreliable unless there is a means to detect the failure of the memory BIST circuit itself.

If the circuitry of the pattern generating unit or the expected value generating unit in the memory BIST circuit suffers failure, an apparent malfunction such as the failure to generate a proper test pattern will be observed. Because of this, the failure of the memory BIST circuit itself can properly be detected through the comparison of expected values. If the expected value comparing unit (for example, the EXOR circuit 34 of FIG. 4) is defective, proper memory failure detection is not at all possible, completely failing to identify where the defect is located. In this embodiment, the signal analyzing circuit 9 is provided with a function to detect the failure of the expected value comparing unit.

Figure 9:
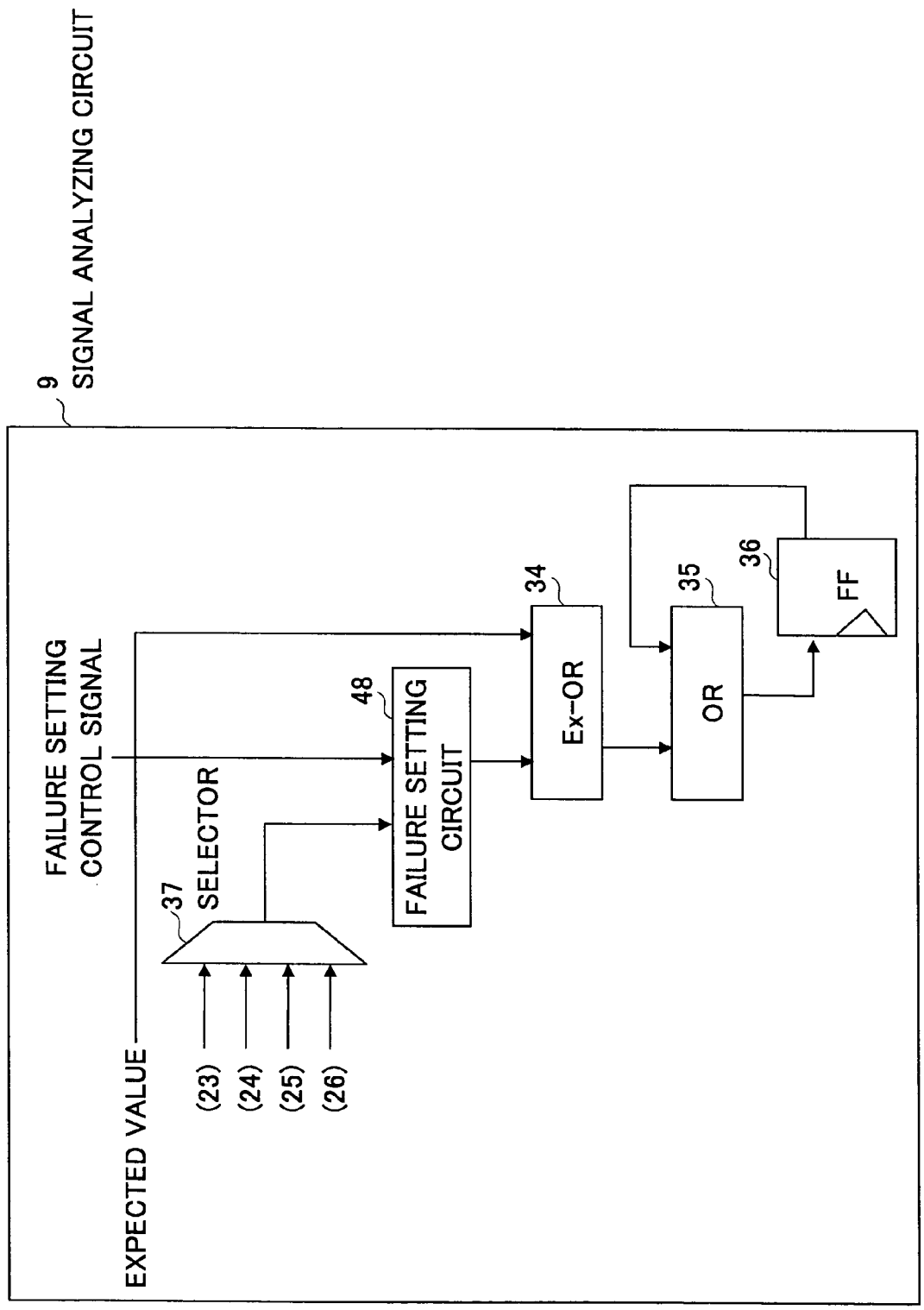
FIG. 9 is a circuit diagram showing an example of the construction of the signal analyzing circuit that is provided with a function to detect the failure of an expected value comparing unit.

FIG. 9 is a circuit diagram showing an example of the construction of the signal analyzing circuit 9 that is provided with a function to detect the failure of an expected value comparing unit. In FIG. 9, the same elements as those of FIG. 4 are referred to by the same numerals, and a description thereof will be omitted.

The signal analyzing circuit 9 of FIG. 9 includes a failure setting circuit 48. The failure setting circuit 48 receives a failure setting control signal. It suffices if the failure setting control signal is comprised of a minimum number of bits necessary for indicating the position of a failed bit. A simple and practical way, however, is to use an n-bit mask signal for setting a failure when the read data is comprised of n bits. When it is desired to create a failure "0" at a particular bit, a mask signal having "0" at that bit and "1" at all the other bits is generated. Then, the failure setting circuit 48 performs an AND operation between the mask signal and the data read from RAM on a bit-by-bit basis. With this provision, a "0" failure is created at the indicated bit position only. If it is desired to create a "1" failure, only a particular bit of the mask signal is set to "1", and an OR operation is performed instead of the AND operation.

Figure 10:
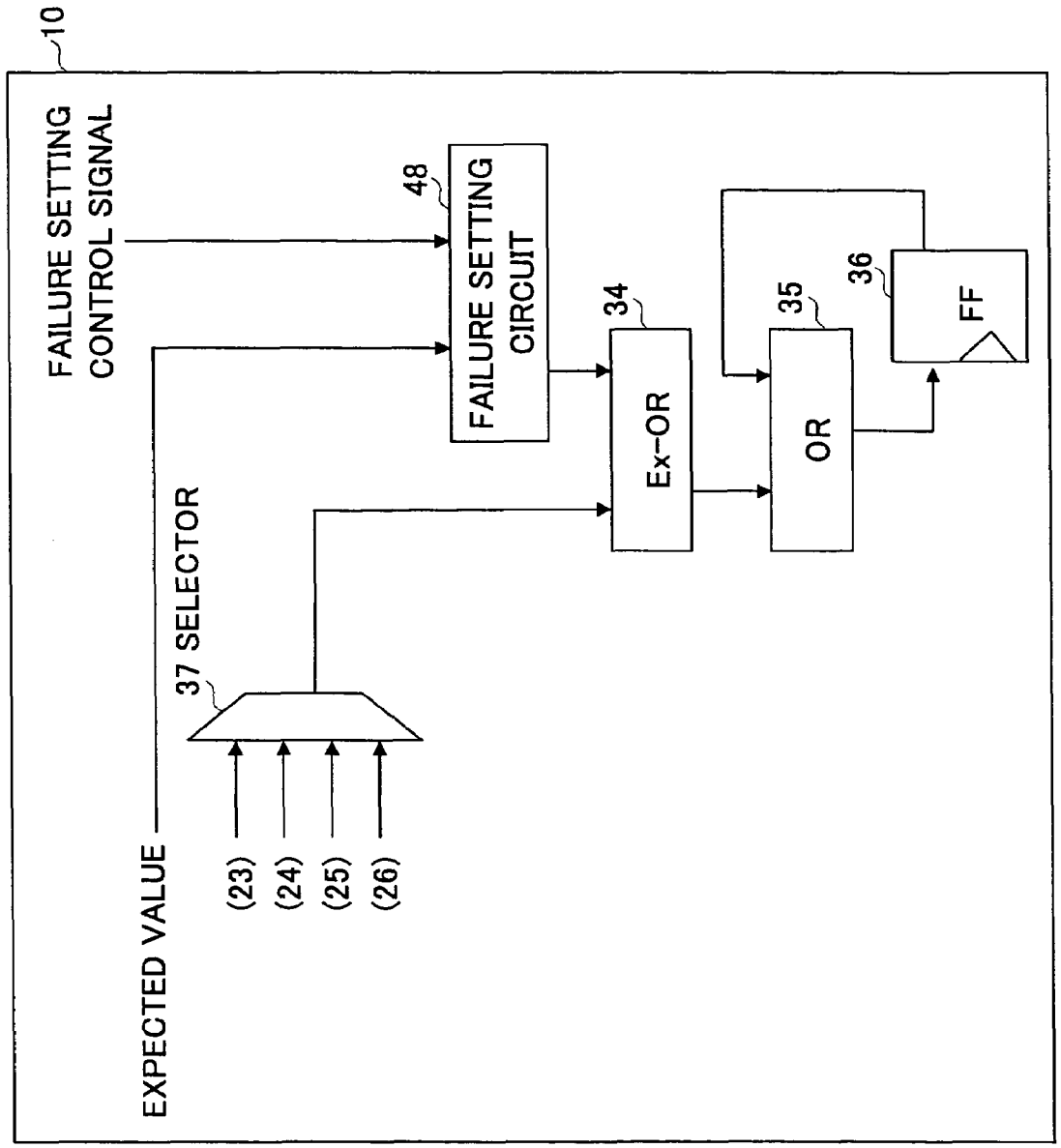
FIG. 10 is a circuit diagram showing another example of the construction of the signal analyzing circuit that is provided with a function to detect the failure of an expected value comparing unit.

FIG. 10 is a circuit diagram showing another example of the construction of the signal analyzing circuit 9 that is provided with a function to detect the failure of an expected value comparing unit. In FIG. 10, the same elements as those of FIG. 9 are referred to by the same numerals, and a description thereof will be omitted.

In the signal analyzing circuit 9 of FIG. 10, the failure setting circuit 48 is provided on the side where an expected value is supplied. With this provision, a desired failure can be created at a particular bit of an expected value supplied from the pattern generating circuit 8. A substantial difference may not exist between the configuration of FIG. 9 and the configuration of FIG. 10 in terms of advantageous results, and either configuration may be employed.

With the failure setting circuit 48 provided in the signal analyzing circuit 9, it is possible to set a deliberate failure prior to an actual memory operation test and to check whether the failure is properly detected. This improves the reliability of memory tests.

In the following, a description will be given of a fourth embodiment of the semiconductor device in which the memory BIST circuit is provided according to the invention.

ASIC is a circuit that is not designed by a manufacturer but is designed by a customer for manufacturing by a manufacturer. When a memory BIST circuit is to be incorporated in an ASIC, therefore, it is difficult to change the whole circuitry design. It is thus desirable to insert a memory BIST wrapper circuit around each memory. The forth embodiment is directed to a construction in which a memory BIST wrapper circuit is provided around each memory.

Figure 11:
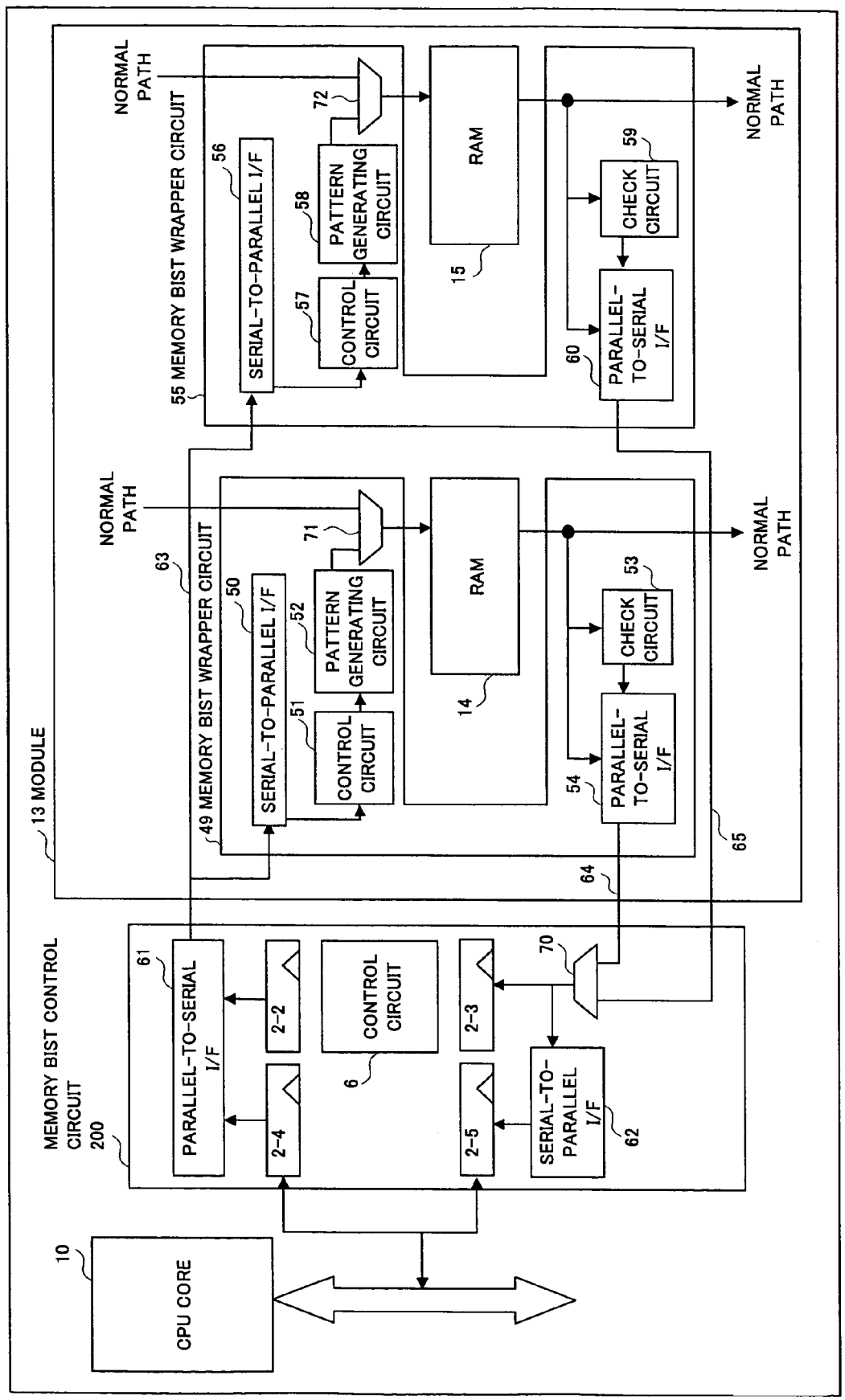
FIG. 11 is a block diagram showing an example of the fourth embodiment of the semiconductor device that is provided with the memory BIST circuit according to the invention.

FIG. 11 is a block diagram showing an example of the fourth embodiment of the semiconductor device that is provided with the memory BIST circuit according to the invention. FIG. 11 includes the CPU core 10, the module 13, and a memory BIST control circuit 200. For the sake of simplicity of explanation and illustration, other circuits are omitted.

The memory BIST control circuit 200 includes the registers 2-2 through 2-5, the control circuit 6, a parallel-to-serial interface circuit (I/F) 61, a serial-to-parallel interface circuit (I/F) 62, and a selector 70. The module 13 includes the in-module RAM 14, the in-module RAM 15, a memory BIST wrapper circuit 49, and a memory BIST wrapper circuit 55. The memory BIST wrapper circuit 49 includes a serial-to-parallel interface circuit 50, a control circuit 51, a pattern generating circuit 52, a check circuit 53, a parallel-to-serial interface circuit 54, and a selector 71. Moreover, the memory BIST wrapper circuit 55 includes a serial-to-parallel interface circuit 56, a control circuit 57, a pattern generating circuit 58, a check circuit 59, a parallel-to-serial interface circuit 60, and a selector 72. In the fourth embodiment shown in FIG. 11, a memory BIST circuit is made up from the memory BIST control circuit 200 and the memory BIST wrapper circuits 49 and 50. As illustrated, the memory BIST wrapper circuits 49 and 55 are provided around the in-module RAMs 14 and 15, respectively, inside the module 13.

In the memory BIST wrapper circuits 49 and 55, the pattern generating circuits 52 and 58 are equivalent to the pattern generating circuit 8 of FIG. 1, and are controlled by the control circuits 51 and 57, respectively. Moreover, the check circuits 53 and 59 compare data read from the respective RAMs for comparison with respective expected values. These expected values are generated by the pattern generating circuits 52 and 58.

The operations of the memory BIST wrapper circuits 49 and 55 are controlled by the memory BIST control circuit 200. The memory BIST control circuit 200 operates under the control of the control circuit 6, and controls overall memory test operations. The memory BIST control circuit 200 transmits control data serially from the parallel-to-serial interface circuit 61 to the signal line 63 based on the settings stored in the registers 2-2 through 2-4.

The serial-to-parallel interface circuit 50 of the memory BIST wrapper circuit 49 receives the control signal from the memory BIST control circuit 200. Based on this control signal, the control circuit 51 of the memory BIST wrapper circuit 49 controls a memory test operation performed with respect to the in-module RAM 14. The selector 71 selects data on the normal path during a normal routine operation, and selects data from the pattern generating circuit 52 during a test operation. Based on the data read from the in-module RAM 14 and the expected value, the check circuit 53 determines whether the in-module RAM 14 is defective. This determination, a signal indicative of the completion of determination, and/or various data obtained at the time of failure analysis are serially transmitted from the parallel-to-serial interface circuit 54, through the signal line 64, to the memory BIST control circuit 200. The operation of the memory BIST wrapper circuit 55 is the same as the operation described above.

The selector 70 of the memory BIST control circuit 200 selects one of the signal line 64 and the signal line 65 corresponding to the respective tested RAMs, and supplies the selected signal to the serial-to-parallel interface circuit 62. Various information obtained from the test operation is stored in the registers 2-3 and 2-5, which are read by access from the CPU core 10.

The memory BIST wrapper circuits 49 and 55 described above carries out the test of memory operations by using the selectors inserted into the normal paths of the in-module RAMs 14 and 15, respectively, so that there is no need to change logic configuration inside the module 13. Therefore, this provision is readily applicable to semiconductor devices of ASIC variations and the like.

Moreover, the use of a serial interface makes it possible to transfer various control commands through a small number of signal lines of one or few bits from the memory BIST control circuit 200. Further, the use of a serial interface makes it possible to transfer the test results and various retrieved data for analysis purposes through a small number of signal lines. In this manner, the number of interface signal lines is kept to a minimum between the memory BIST control circuit 200 for overall control and each memory BIST wrapper circuit 49 or 55.

In the result-storage register 2-3 of the memory BIST control circuit 200, each bit may be assigned to a corresponding memory. Provision is then made such that as a signal indicative of test completion is asserted from a wrapper circuit, a signal indicative of test results from this wrapper circuit is stored in the corresponding bit of the result-storage register 2-3. With regard to the reading of various data at the time of failure analysis, information about desired data may be transmitted to a wrapper circuit in advance according to a setting in the control register of the memory BIST control circuit 200. In this case, the wrapper circuit recognizes that an operation is in a failure analysis mode, and also recognizes data desired for analysis. The wrapper circuit then obtains the desired data through a desired test operation, and sends the data to the memory BIST control circuit 200.

In the following, a description will be given of a method of checking by use of a program and a memory BIST circuit whether a memory properly operates at the time of a voltage change.

Reduction of an internal power supply voltage increases the delay of each logic element constituting the circuitry of a semiconductor device, thereby significantly affecting the operation of a memory having sense amplifiers or the like. It is possible that, as a result of this, the proper operation of a memory cannot be guaranteed (e.g., failing to satisfy the required access time). There is a limit as to what can be done by program-based memory access to guarantee a memory operation after such voltage reduction. Accordingly, it is desirable to verify that there will be no problem with the memory operation by using the memory BIST circuit dedicated for a memory test. In a memory test based on the conventional scan system, it is impossible to test a memory by using a BIST circuit under the program-based control of the CPU. The memory BIST circuit of the invention, however, is controllable through a program, and may be utilized on other occasions in addition to the test at the time of shipping out.

Figure 12:
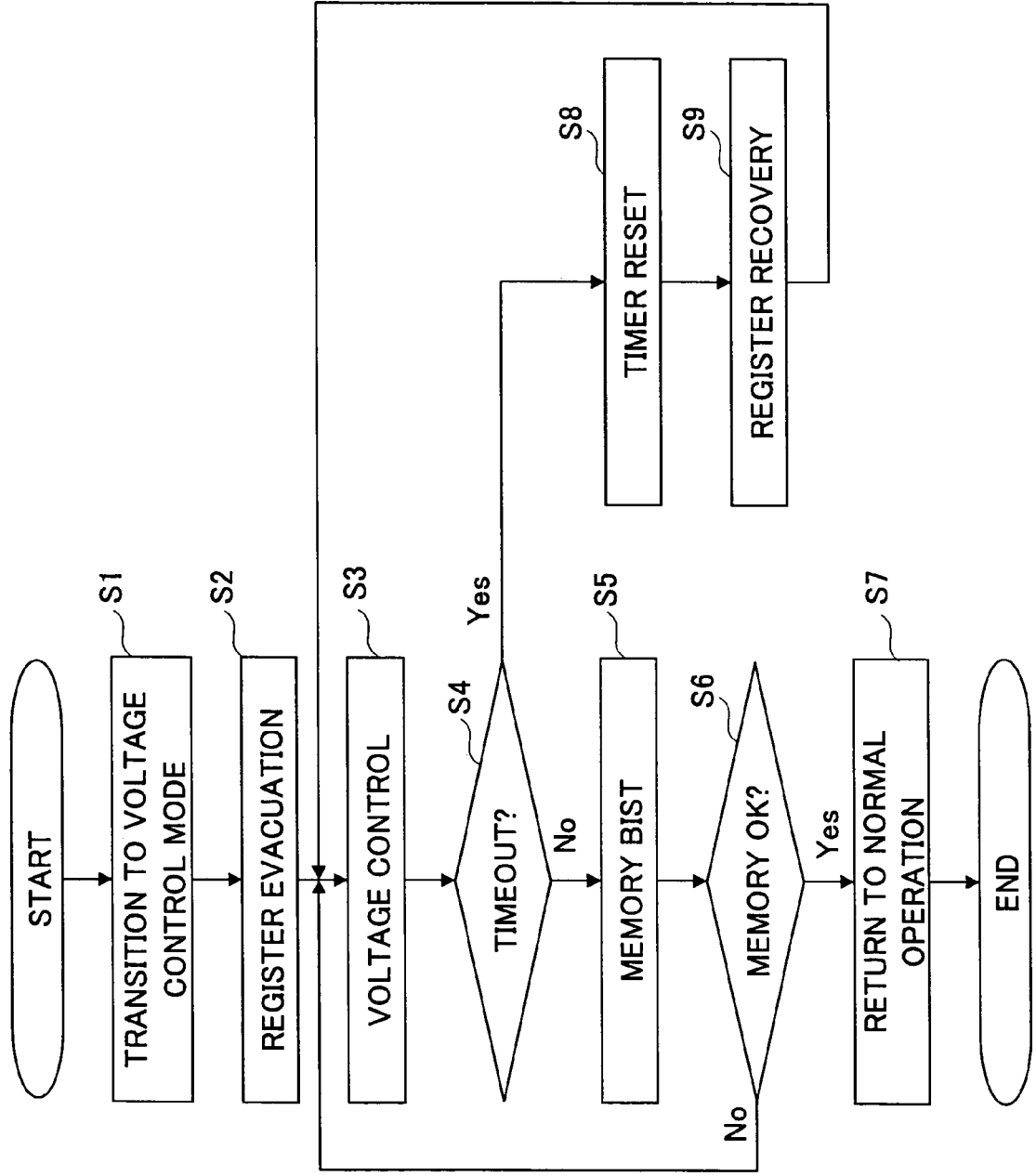
FIG. 12 is a flowchart showing a method of checking a memory operation at the time of a voltage change.

FIG. 12 is a flowchart showing a method of checking a memory operation at the time of a voltage change.

At step S1, a transition to a voltage control mode is made. At step 2, the contents of registers are evacuated. Namely, as preparation for a situation in which the execution of a program at the CPU core comes to a sudden stop in response to voltage reduction, data stored in internal registers and the like are copied to an external SDRAM, nonvolatile memory, or the like.

At step S3, voltage control is carried out. For example, the voltage is stepped down. The above description has been given with reference to a problem associated voltage step-down. If there is a need to check a memory operation at the time of a voltage increase, the voltage is boosted at step S3. This voltage control may be carried out by providing the semiconductor device with a power supply controlling unit that is controllable by a program instruction, and by controlling a variable-voltage generating source according to the setting of the power supply controlling unit.

At step S4, a check is made as to whether timeout has occurred. That is, a watch-dog timer or the like provided in the voltage controlling unit or the like detects timeout, thereby detecting hangup. In response to the detection of timeout, the timer is reset at step S8. Internal reset is triggered in response, and a boot processing routine or the like detects a flag or the like indicative of the occurrence of timeout in a register associated with voltage control. At step S9, a standby state of an external memory (e.g., self-refreshment mode of an SDRAM) is brought to an end to recover the data in the registers. The procedure then returns to step S3, followed by another round of voltage control with more lenient conditions as may be necessary this time.

If no timeout is detected at step S4, a memory BIST test is performed at step S5. At step S6, a check is made based on the results of the test as to whether the memory is defective.

If a defect is found in the memory, the procedure returns to step S3, followed by another round of voltage control with more lenient conditions as may be necessary this time. If no defect is found in the memory, a transition to a normal operation is made at step S7. Namely, an operation of application or the like is resumed in the conditions in which a voltage setting, a clock frequency setting, and the like are stable.

When voltage is controlled, the state of cache-off is imposed in advance in which an instruction cache and a data cache are not used in the CPU core. If the results of a memory BIST test after a voltage change indicate the normalcy of a memory operation, then, it is confirmed that the memory can properly operate at the current internal voltage. In this case, therefore, the instruction cache and data cache in the CPU core are brought back in the on-state, thereby resuming a normal operation.

Moreover, the memory BIST circuit of the invention may be used to conduct a data retention test. To this end, a BIST operation is suspended at an indicated location in the middle of the operation of the memory BIST circuit, and is then resumed in response to a program instruction or the like from the state in which it was stopped.

In the case of a RAM test operation, for example, an actual sequence will be as follows.

In the middle of a RAM-BIST test, the operation of the memory BIST circuit is suspended. For example, the operation of the memory BIST circuit is brought to a halt when the writing of data finishes for a march or checkered board test. The RAM with such data written therein is thus obtained.

With everything being kept as it is, a voltage is changed through program control or the like. After the passage of a fixed period, the voltage is returned to its original level through program control or the like, and the RAM-BIST operation, which has been suspended, is resumed. The resumed test operation then checks whether the written data is correctly read. This achieves a data retention test.

As described above, the method of checking a memory operation at the time of a voltage change can perform a memory test by use of a program and a memory BIST circuit at the time the internal power supply voltage is controlled. This makes it possible to conduct a test for each voltage level with respect to the memory that is susceptible to voltage changes, thereby guaranteeing the operation of a semiconductor device at the time of power-supply voltage control. Such method of checking memory operations is useful when reduction in power consumption is sought in large-scale integrated circuits.

Further, the present invention is not limited to these embodiments, but various variations and modifications may be made without departing from the scope of the present invention.

What is claimed is:

1. A semiconductor device, comprising:
a CPU core circuit;
a bus connected to said CPU core circuit; and
a memory BIST circuit configured to perform a memory test in response to an instruction supplied from said CPU core circuit through said bus;
a first signal line for supplying an address signal from said memory BIST circuit to a memory;
a second signal line for supplying a data signal from said memory BIST circuit to the memory;
a third signal line for supplying read data from the memory to said memory BIST circuit; and
one or more pipeline registers provided along a path of at least one of said first through third signal lines,
wherein said first through third signal lines are separate from said bus, and
wherein said memory BIST circuit includes:
a register that is accessible by said CPU core circuit through said bus; and
a control circuit configured to control the memory test according to what is stored in said register; and
a signal analyzing unit configured to compare data read from the memory with an expected value to store a result of the comparison in said register,
wherein said signal analyzing circuit includes;
a comparison circuit configured to compare the read data with the expected value; and
a timing adjusting circuit configured to change timing at which said expected value is supplied to said comparison circuit, the changing of the timing being made in response to a number of stages of said one or more pipeline registers provided along the path between the memory and said memory BIST circuit.

2. The semiconductor device as claimed in claim 1, wherein said memory BIST circuit includes:
an address generating circuit configured to generate the address signal under control of said control circuit; and
a pattern generating circuit configured to generate the data signal under control of said control circuit.

3. The semiconductor device as claimed in claim 2, wherein said memory BIST circuit asserts a busy signal at the time the memory test is performed, and said CPU core circuit suspends an operation for executing an instruction in response to the assertion of the busy signal.

4. The semiconductor device as claimed in claim 2, wherein said address generating circuit and said pattern generating circuit are provided in each of a plurality of memories, said semiconductor device further comprising a serial interface configured to transmit a control signal from said control circuit to said address generating circuit and said pattern generating circuit.

5. The semiconductor device as claimed in claim 2, wherein said signal analyzing circuit is provided in each of a plurality of memories, said semiconductor device further comprising a serial interface configured to transmit data from said signal analyzing circuit to said register.

6. The semiconductor device as claimed in claim 2, wherein said signal analyzing circuit further includes a mask circuit configured to mask the read data and the expected value.

7. The semiconductor device as claimed in claim 2, wherein said signal analyzing circuit further includes a failure setting circuit configured to create a failed value in at least one of the read data and the expected value.

8. The semiconductor device as claimed in claim 2, wherein said signal analyzing circuit immediately asserts a stop signal when a mismatch occurs between the read data and the expected value, and wherein said control circuit, said address generating circuit, and said pattern generating circuit suspend operation while holding an internal operation state thereof in response to the assertion of the stop signal.

9. The semiconductor device as claimed in claim 8, wherein said CPU core circuit is configured to read said internal operation state through said register.

10. The semiconductor device as claimed in claim 8, wherein said memory BIST circuit is configured to resume operation from a state where operation was suspended while holding the internal operation state.

11. The semiconductor device as claimed in claim 1, wherein at least one of said bus and said memory BIST circuit is external to said CPU core circuit.

* * * * *

UNITED STATES PATENT AND TRADEMARK OFFICE
CERTIFICATE OF CORRECTION

PATENT NO. : 7,484,141 B2 Page 1 of 1
APPLICATION NO. : 10/893412
DATED : January 27, 2009
INVENTOR(S) : Takashi Shikata It is certified that error appears in the above-identified patent and that said Letters Patent is hereby corrected as shown below:

On the title page item (73), change "Fujitsu Microelectronic Limited" to --Fujitsu Microelectronics Limited--.

Column 16, Line 39, change "81ST" to --BIST--.

Signed and Sealed this

Seventh Day of April, 2009

JOHN DOLL
*Acting Director of the United States Patent and Trademark Office*